United States Patent [19]
Pfister

[11] Patent Number: 5,444,731
[45] Date of Patent: Aug. 22, 1995

[54] SEMICONDUCTOR LASER ARRAY HAVING A PLURALITY OF VERTICAL CAVITIES AND PROVIDING A MONOLOBE EMISSION BEAM

[75] Inventor: Jean-Claude Pfister, Montbonnot, France

[73] Assignee: Commissariat a l'Energie Atomique, Paris Cedex, France

[21] Appl. No.: 244,047

[22] PCT Filed: Nov. 25, 1992

[86] PCT No.: PCT/FR92/01097
§ 371 Date: May 24, 1994
§ 102(e) Date: May 24, 1994

[87] PCT Pub. No.: WO93/11590
PCT Pub. Date: Jun. 10, 1993

[30] Foreign Application Priority Data
Nov. 26, 1991 [FR] France .................... 91 14563

[51] Int. Cl.$^6$ ............................................. H01S 3/08
[52] U.S. Cl. .............................. 372/99; 372/46; 372/50; 372/92
[58] Field of Search .................. 372/50, 99, 96, 92, 372/45, 46

[56] References Cited
PUBLICATIONS

M. Orenstein et al, "Two-dimensional phase-locked arrays of vertical-cavity semiconductor lasers by mirror reflectivity modulation", Appl. Phys. Lett 58(8) 25 Feb. 1991 pp. 804–806.

D. G. Deppe et al, "Phase-coupled two-dimensional $Al_xGa_{1-x}As$-GaAs vertical-cavity surface-emitting laser array", Appl. Phys. Lett. 56 (21), May 21, 1990, pp. 2089–2091.

H. J. Yoo et al, "Phase-Locked Two-Dimensional Arrays of Implant Isolated Vertical Cavity Surface Emitting Lasers", Electronic Letters, 8th Nov. 1990, vol. 26, No. 23 pp. 1944–1946.

D. G. Deppe et al, "Bistability in an AlAs-GaAs-InGaAs Vertical-Cavity Surface-emitting laser", Appl. Phys. Lett 58(23) 10 Jun. 1991, pp. 2616–2618.

Primary Examiner—James W. Davie
Attorney, Agent, or Firm—Oblon, Spivak, McClelland, Maier & Neustadt

[57] ABSTRACT

The laser array according to the invention comprises a conductor substrate (1), and on said substrate, in succession a lower mirror (2), an optically active layer (4) and an upper mirror (6,7). The upper mirror comprises a matrix of high reflectivity areas (14) and lower reflectivity areas (12), as well as metallized areas (8) serving as current leads, said metallized areas (8) being positioned above the lower reflectivity areas (12). Application to optics.

7 Claims, 1 Drawing Sheet

SEMICONDUCTOR LASER ARRAY HAVING A PLURALITY OF VERTICAL CAVITIES AND PROVIDING A MONOLOBE EMISSION BEAM

BACKGROUND OF THE INVENTION

1. Field of the Invention

The present invention relates to a semiconductor laser array. It can be used in numerous fields such as optical telecommunications, optical pumping, treatment of materials, etc.

2. Prior Art

The increase in the power of semiconductor lasers cannot be obtained merely by increasing the active surface, because instabilities of modes and emitter filaments which are poorly controlled occur. It is therefore necessary to define elementary emitters formed by active areas having small lateral dimensions. The power increase is then obtained by multiplying said elementary emitters.

A considerable beam quality improvement is obtained by ensuring a coherence of the optical phase between the emitters by coupling them together. The simplest coupling is obtained by evanescent wave (i.e. by covering the evanescent parts of the modes of two adjacent elementary emitters). This type of coupling favours the oscillation of two adjacent emitters in phase opposition, which leads to a multilobe radiation pattern. In the case of multistrip lasers, where the lightwave propagates parallel to the semiconductor surface, various means have been proposed for ensuring an inphase coupling, which produces an emission in a single lobe, perpendicular to the exit face (generally obtained by cleaving). This method is e.g. described in the article by J. Katz et al "Diffraction coupled phase locked semiconductor laser array" published in Appl. Phys. Lett., 42, (7), Apr. 1, 1983, pp. 554–556 and L. J. Mawst et al entitled "CW high-power diffraction-limited-beam operation from resonant optical waveguide arrays of diode lasers" published in Appl. Phys. Lett., 58 (1), Jan. 7, 1991, pp. 22–24.

The recent development of vertical cavity lasers emitting by the surface makes it possible to envisage matrixes of emitter points instead of an emitting line, as well as an emission perpendicular to the surface of the semiconductor chip and not on the edge, without involving technical complications. Such matrixes are in particular described in the article by M. Orenstein et al entitled "Two-dimensional phase-locked arrays of vertical-cavity semiconductor lasers by mirror reflectivity modulation" published in Appl. Phys. Lett., 58 (8), Feb. 25, 1991, pp. 804–806.

In general, a matrix of lasers of this type comprises a conductive substrate and, on said substrate, a lower mirror, an active layer (optionally surrounded by confinement layers) and an upper mirror formed by a matrix of reflecting areas (e.g. a matrix of 4×4 areas). The coupling between the different vertical elements is obtained by diffraction at the edges of the reflecting areas. The complete structure behaves like a plurality of lasers (16 in the case of a 4×4 matrix) slightly coupled together.

Although such structures are interesting in certain respects, they still suffer from the disadvantage of leading to a multilobe beam, which is therefore only slightly directional. This disadvantage is due to the fact that the coupling produced leads to a phase opposition between adjacent elementary lasers, which causes an anti-symmetric radiation pattern.

SUMMARY OF THE INVENTION

The object of the invention is to obviate this disadvantage. To this end, it proposes a structure which is once again an array of vertical cavities, but whose emission beam is now monolobe instead of multilobe. This result is essentially obtained by a novel structure of the upper mirror. According to the invention, said mirror comprises a plurality of high reflectivity areas surrounded by lower reflectivity areas and also comprises metallized areas serving as current leads, said metallized areas being positioned above the lower reflectivity areas. The higher reflectivity areas can be organized in matrix form.

Thus, in the structure according to the invention, the injected current density is not homogeneous and has a distribution such that the current density maxima correspond to the reflectivity minima of the upper mirror. The applicant has observed that under these conditions the optical coupling caused a bringing into phase of the different laser elements, which leads to a monolobe radiation pattern. The lower reflectivity areas are used for separating the elementary monomode resonators.

Therefore the invention leads to two main advantages. Compared with inphase-coupled multistrip lasers, there is a possibility of having an emissive surface in place of a line and consequently a reduced angular divergence in the two directions without introducing cylindrical optics, as well as a limited power density on the exit face permitting a higher reliability. Compared with existing vertical cavity laser arrays, the inphase coupling produces a high geometrical quality light beam directly usable or usable by means of a simple optics.

DETAILED DESCRIPTION OF AN EMBODIMENT

Figure 1:
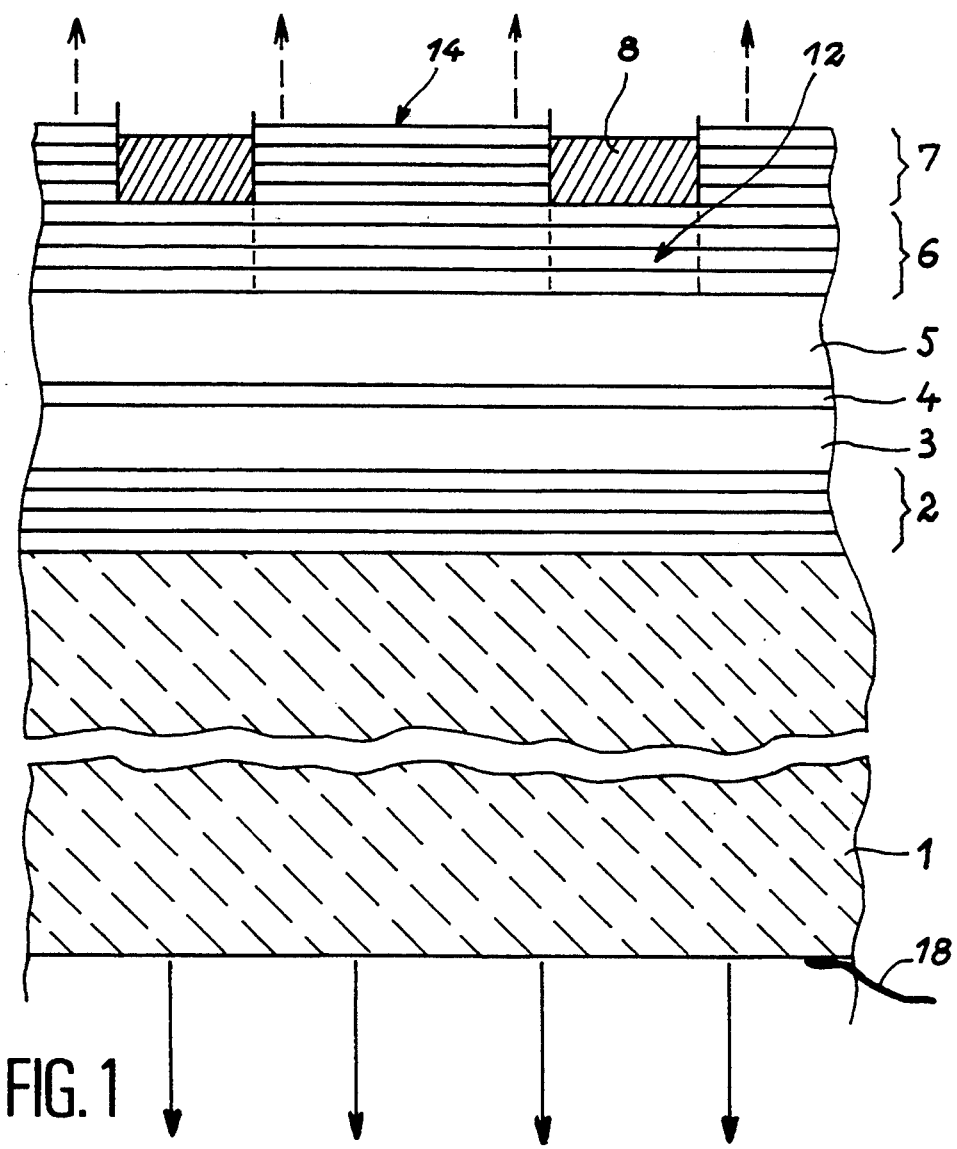
FIG. 1 illustrates in section a variant of an array according to the invention.
Figure 2:
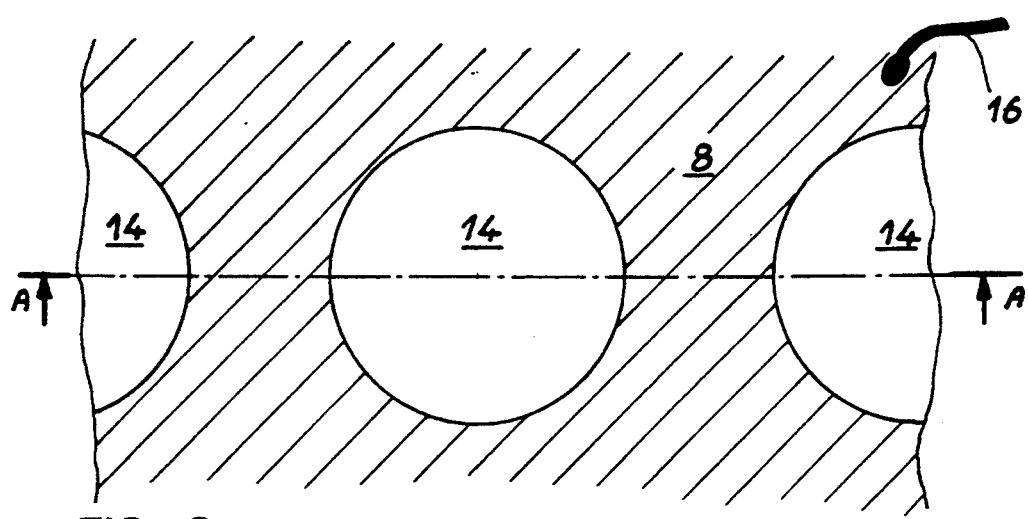
FIG. 2 the structure in plan view.

The structure illustrated in FIG. 1 is a section through a plane passing through the diameter of high reflectivity mirrors (line AA in FIG. 2). This structure comprises:

- a monocrystalline, conductive substrate 1 (e.g. of n+ type GaAs), which can be transparent to the emitted wavelength, said substrate being provided with an electrical connection 18 serving as a current lead,
- a lower mirror 2, e.g. constituted by a stack of alternately high and low index layers of thickness $\lambda/4$, in which $\lambda$ is the wavelength used and highly doped of the same type as the substrate (e.g. 15 to 25 periods of type n $Ga_xAl_{1-x}As/Ga\ Al_{1-y}As$ doped at 3 to $10 \times 10^{18}$ cm$^{-3}$),
- a gradual index confinement layer 3,
- an active layer 4, e.g. constituted by one or more quantum wells of composition and thickness appropriate for the desired wavelength (e.g. of 8 nm $Ga_{0.8}In_{0.2}As$ between GaAs barriers) having a limited or zero doping,
- a confinement layer 5 substantially symmetrical to the layer 3, a common upper mirror part 6 having a structure identical to the structure 2, with a smaller number of layers and an opposite doping type (e.g. 8 to 12 periods of p type $Ga_xAl_{1-x}As/Ga_yAl_{1-y}As$ doped at 3 to $10 \times 10^{18}$ cm$^{-3}$)

a complementary part 7 of the upper mirror (e.g. 5 to 10 periods with a structure equivalent to the mirror 6 or 2 to 5 periods of $Si/SiO_2$ deposited with a thickness of $\lambda/4$ by sputtering), metallizations 8.

Thus, beneath the metallizations 8, there are lower reflectivity areas 12 and, outside these, metallizations of the higher reflectivity areas 14.

In order to obtain such a structure or any equivalent structure, two different procedures can be used, the one being of the all epitaxied type and the other of a mixed type.

a) All epitaxied procedure.

In the all epitaxied procedure, in a first phase, epitaxy takes place of a complete multilayer system comprising the lower mirror, the active layer or layers and the upper mirror (common part and complementary part). This group of operations is performed in accordance with the prior art by an epitaxy method such as molecular beam epitaxy or by chemical vapour deposition. The wafer obtained from the epitaxy frame is then treated by standard photolithographic means (resin deposition, irradiation for masking, chemical or plasma attack for hollowing out the trenches necessary in the upper part of the mirror—complementary mirror). A metal deposit followed by a second masking stage completes the definition of the electrodes.

b) Mixed procedure.

In the mixed procedure, the stack of epitaxied layers is obtained in the same way up to the common part of the upper mirror. The wafer is then extracted from the epitaxy frame in order to undergo a metallization and then the current leads undergo photolithography. This is followed by the deposition of the complementary mirror. This deposition can take place without any disadvantage by conventional means such as cathodic sputtering or vacuum evaporation and can apply to materials differing from the alloys used in the active part, such as silicon and silica, which permit more pronounced optical index jumps and therefore a smaller number of layers. A supplementary masking and lithography stage will electrically give access to the metallizations, but it is not necessary to open this access to the system of electrodes and therefore this stage is not very critical.

The mirrors 2,6 and 7 can be designed in such a way that the light emission takes place either through the mirrors 6 and 7, or through the substrate and said two mirrors, or through the substrate alone, which in the two latter cases must be transparent to the emitted wavelength.

FIG. 2 shows in plan view the high reflectivity areas and, around the latter, the metallization coating 8 which, in the illustrated variant, is in one piece. FIG. 2 also shows a connection 16 serving as a current lead.

It would naturally be possible to have high reflectivity areas 14 which are not circular and instead square or rectangular.

It would not fall outside the scope of the present invention to replace the stack of $\lambda/4$ layers in the mirrors by a more complex reflecting stack e.g. intended for improving the current conduction. Moreover, whilst retaining the same structure, an independent electric access can be provided to at least some of the current leads, which makes it possible to electrically check the corresponding couplings and therefore the emission indicatrix of the laser array.

It is also possible to produce a device in which the plurality of high reflectivity mirrors is not strictly organized in matrix form, but instead in accordance with a different pattern appropriate for the envisaged applications (e.g. circular).

I claim:

1. Semiconductor laser array comprising a conductive substrate (1) and, on said substrate, in succession a lower mirrors (2), an optically active layer (4) and an upper mirror (6,7,12,14), characterized in that the upper mirror comprises a plurality of high reflectivity areas (14) positioned adjacent to lower reflectivity areas (12) and also comprises metallized areas (8) serving as current leads, said metallized areas (8) being positioned above the lower reflectivity areas (12).

2. Laser array according to claim 1, characterized in that the upper mirror (6,7) comprises a stack of alternately high and low index layers with a smaller number of layers in the lower reflectivity areas (12) than in the high reflectivity areas (14).

3. Laser array according to claim 1, characterized in that the upper mirror comprises a stack of alternately strong and weak index layers (6) and, in the high reflectivity areas (14), a supplementary reflecting means (7) for increasing said reflectivity.

4. Laser array according to claim 1, characterized in that the upper mirror comprises a stack of alternately high and low index layers (6,7), said stack having etched areas (8) defining the lower reflectivity areas.

5. Laser array according to claim 1, characterized in that the active layer (4) is positioned adjacent to two confinement layers (3,5).

6. Laser array according to claim 1, characterized in that the active layer (4) is of the multiple quantum well type.

7. Laser array according to claim 1, characterized in that the substrate (1) is transparent.

* * * * *